United States Patent
Jin et al.

(10) Patent No.: US 10,068,989 B2
(45) Date of Patent: Sep. 4, 2018

(54) SUBSTRATE FOR DISPLAY DEVICE, DISPLAY DEVICE INCLUDING THE SUBSTRATE, AND METHOD OF MANUFACTURING THE DISPLAY DEVICE

(71) Applicant: Samsung Display Co., Ltd., Yongin, Gyeonggi-Do (KR)

(72) Inventors: Guang-Hai Jin, Yongin (KR); Jae-Beom Choi, Yongin (KR); Kwan-Wook Jung, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 88 days.

(21) Appl. No.: 13/947,945

(22) Filed: Jul. 22, 2013

(65) Prior Publication Data
US 2014/0167050 A1 Jun. 19, 2014

(30) Foreign Application Priority Data
Dec. 13, 2012 (KR) .................. 10-2012-0145712

(51) Int. Cl.
*H01L 29/786* (2006.01)
*H01L 29/66* (2006.01)
*H01L 27/12* (2006.01)

(52) U.S. Cl.
CPC ...... *H01L 29/66757* (2013.01); *H01L 27/127* (2013.01)

(58) Field of Classification Search
CPC .............. H01L 33/18; H01L 51/5281; H01L 29/66757; H01L 27/127
USPC .......... 257/40, 49, 66, 72, E21.409, E29.255
See application file for complete search history.

(56) References Cited

U.S. PATENT DOCUMENTS

| 7,417,694 B2 | 8/2008 | Kim et al. |
| 7,485,507 B2 | 2/2009 | Ahn et al. |
| 9,412,763 B2 | 8/2016 | Morosawa |
| 2003/0141811 A1* | 7/2003 | Park .................. H01L 27/1255 313/506 |

(Continued)

FOREIGN PATENT DOCUMENTS

| CN | 1753202 A | 3/2006 |
| CN | 1790749 A | 6/2006 |

(Continued)

OTHER PUBLICATIONS

Taiwanese Office Action dated Dec. 29, 2016 for Taiwan Patent Application No. TW102131757 which shares priority of Korean Patent Application No. KR 10-2012-0145712 with subject U.S. Appl. No. 13/947,945, and which cites the above-identified references numbered 4-7.

(Continued)

*Primary Examiner* — Michael Carter
*Assistant Examiner* — Mohammed R Alam
(74) *Attorney, Agent, or Firm* — Knobbe Martens Olson & Bear LLP (57) ABSTRACT

A substrate for a display device is disclosed. In one aspect, the substrate includes an active layer that is formed on substantially the entire portion of the bottom substrate and comprises a first area and a second area with a higher carrier concentration than the first area. The substrate also includes a line overlapping with the first area and a contact electrode that electrically connects the line to the second area of the active layer.

20 Claims, 7 Drawing Sheets

(56) References Cited

U.S. PATENT DOCUMENTS

| | | | |
|---|---|---|---|
| 2006/0060855 A1* | 3/2006 | Lee | H01L 27/1214 |
| | | | 257/59 |
| 2006/0164566 A1* | 7/2006 | Choi | G02F 1/136227 |
| | | | 349/43 |
| 2007/0046846 A1 | 3/2007 | Ono | |
| 2008/0007155 A1* | 1/2008 | Adachi | G02B 5/3016 |
| | | | 313/498 |
| 2009/0224249 A1 | 9/2009 | Miyairi et al. | |
| 2011/0090438 A1* | 4/2011 | Lee | G02F 1/136209 |
| | | | 349/110 |
| 2011/0140107 A1* | 6/2011 | Kang et al. | 257/57 |

FOREIGN PATENT DOCUMENTS

| | | |
|---|---|---|
| JP | 2005-222067 A | 8/2005 |
| JP | 5046915 B2 | 7/2012 |
| KR | 10-2002-0090741 A | 5/2002 |
| KR | 10-2012-0076181 A | 7/2012 |
| TW | 200950583 A1 | 12/2009 |
| TW | 201248846 A1 | 12/2012 |

OTHER PUBLICATIONS

Taiwanese Office Action dated Jun. 15, 2017 for Taiwan Patent Application No. TW102131757 which shares priority of Korean Patent Application No. KR 10-2012-0145712 with subject U.S. Appl. No. 13/947,945, and which cites the above-identified references numbered 1 and 3.

* cited by examiner

SUBSTRATE FOR DISPLAY DEVICE, DISPLAY DEVICE INCLUDING THE SUBSTRATE, AND METHOD OF MANUFACTURING THE DISPLAY DEVICE

CROSS-REFERENCE TO RELATED PATENT APPLICATION

This application claims the benefit of Korean Patent Application No. 10-2012-0145712, filed on Dec. 13, 2012, in the Korean Intellectual Property Office, the disclosure of which is incorporated herein in its entirety by reference.

BACKGROUND

1. Field

The described technology generally relates to a substrate for a display device, including a line, a display device including the substrate, and a method of manufacturing a display device.

2. Description of the Related Technology

A display device is mounted on a substrate with a pattern including a thin film transistor (TFT), a capacitor, and a line connecting the TFT and the capacitor. A substrate on which a display device is to be mounted, a mask with a fine pattern is used to transfer the pattern thereon to form a fine pattern including, for example, a TFT or the like.

Transferring a pattern by using a mask may be performed by, in general, photo-lithography. According to a photo-lithography process, photoresist is homogeneously doped on a substrate which is to have a pattern, and then, the photoresist is exposed by using an exposure equipment, such as a stepper, and then, (in the case of a positive photoresist), the exposed photoresist is subjected to developing. In addition, after the developing of the photoresist, a pattern is formed by etching using the residual photoresist as a mask, and an unnecessary photoresist is removed.

SUMMARY

One inventive aspect is a substrate for a display device, preventing a parasitic capacitance in a line, a display device including the substrate, and a method of manufacturing a display device.

Another aspect is a substrate for a display device, including: an active layer that is formed on substantially the entire portion of the bottom substrate and includes a first area and a second area with a higher carrier concentration than the first area; a line overlapping with the first area; and a contact electrode that electrically connects the line to the second area of the active layer.

The second area does not overlap with the line and is disposed adjacent to the line. The active layer includes silicon.

The substrate may further include a first insulating layer covering the active layer and including a first opening exposing the second area, wherein the line is formed overlapping with the first area on the first insulating layer.

The substrate may further include a second insulating layer including a second opening covering the line and exposing a portion of the line and a third opening connected to the first opening.

An area of the second area corresponds to a size of the third opening. A thickness of the second insulating layer is greater than a thickness of the first insulating layer. The contact electrode is formed on the second insulating layer and electrically connects the line to the active layer via the first opening, the second opening, and the third opening. The line is electrically connected to a thin film transistor. The line is divided into a plurality of lines and then summed up, and the contact electrode is disposed where the line is divided into a plurality of lines and then summed up.

Another aspect is a display device including: an active layer that is formed on substantially the entire portion of the bottom substrate and includes a first area and a second area with a higher carrier concentration than the first area; a thin film transistor including a portion of the active layer, a gate electrode, a source electrode, and a drain electrode; a display device that is connected to the thin film transistor and emits light; a gate line that is electrically connected to the gate electrode and overlaps with the first area; and a contact electrode that electrically connects the gate line to the second area.

The display device may further include a first insulating layer covering the active layer and including a first opening exposing the second area, wherein the gate line is formed overlapping with the first area on the first insulating layer.

The display device may further include a second insulating layer including a second opening covering the gate line and exposing a portion of the line and a third opening connected to the first opening, wherein the source electrode and the drain electrode are formed on the second insulating layer, corresponding to the active layer.

An area of the second area corresponds to a size of the third opening. A thickness of the second insulating layer is greater than a thickness of the first insulating layer. The contact electrode is formed on the second insulating layer and electrically connects the gate line to the active layer via the first opening, the second opening, and the third opening. The contact electrode is formed at the same level and is formed of a same material as the source electrode and the drain electrode.

Another aspect is a method of manufacturing a display device, including: forming a semiconductor layer on substantially the entire area of a bottom substrate; a first mask process for forming a gate electrode of a thin film transistor and a gate line on the semiconductor layer; a second mask process for forming an interlayer insulating layer having openings exposing a portion of the semiconductor layer corresponding to a circuit area, a portion of the gate line, and a portion of the semiconductor layer adjacent to the gate line; forming an active layer by doping the portion of the semiconductor layer corresponding to the circuit area and the portion of the semiconductor layer adjacent to the gate line via the openings; and a third mask process for forming a source electrode and a drain electrode, contacting the active layer corresponding to the circuit area, and a contact electrode contacting the portion of the gate line and the portion of the semiconductor layer adjacent to the gate line.

The method may further include: after the first mask process, forming a gate insulating layer covering the gate electrode and the gate line, wherein the second mask process is performed to form openings in the gate insulating layer to expose the portion of the semiconductor layer corresponding to the circuit area and the portion of the semiconductor layer adjacent to the gate line.

A thickness of the interlayer insulating film is greater than a thickness of the gate insulating film. The forming of the active layer may be performed by using the interlayer insulating layer as a mask. The semiconductor layer may include silicon.

DETAILED DESCRIPTION

When a pattern is transferred by using a mask, a mask with a required pattern needs to be prepared before the transferring. Accordingly, when the number of processes using a mask increases, manufacturing costs for the preparation of a mask increase. Accordingly, a structure for reducing the number of required masks is required.

The number of required masks can be reduced by omitting patterning of a particular layer. In this case, however, overlapping of layers may occur where the overlapping is not intended to occur, and also, undesired cap coupling may lead to a parasitic capacitance. In particular, when a parasitic capacitance occurs in a line, an RC delay may occur, and thus, a display quality of a display device may decrease.

The terms such as "first" and "second" are used herein merely to describe a variety of constituent elements, but the constituent elements are not limited by the terms. The terms are used only for the purpose of distinguishing one constituent element from another constituent element.

It will be understood that when a layer is referred to as being "on" another layer, film, area or substrate, it can be directly on the other layer, film, area or substrate, or intervening layers may also be present.

In the drawings, the thicknesses of layers and areas are extended for clarity of description. Also, in the drawings, for convenience of description, the thicknesses of some of layers or areas may be exaggerated.

Embodiments will now be described more fully with reference to the accompanying drawings. Material identical or corresponding components are labelled with identical reference numerals, and description thereof will not be repeated.

Figure 1:
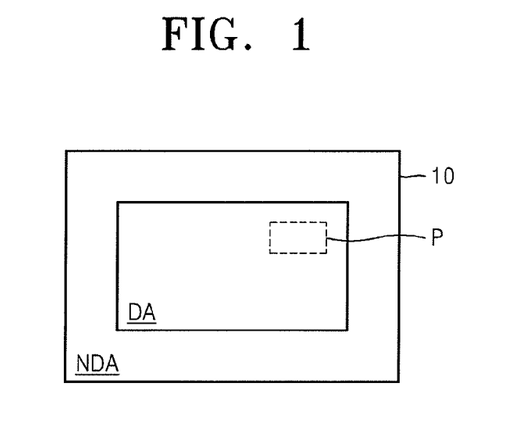
FIG. 1 is a schematic conceptual view of a display device according to an embodiment.
Figure 2:
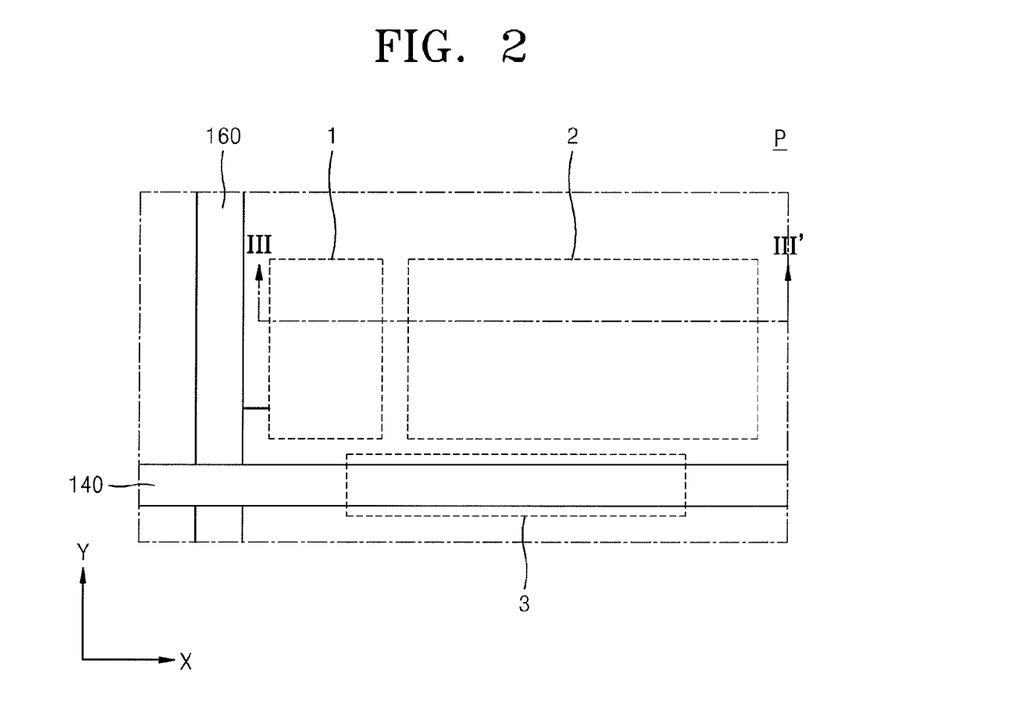
FIG. 2 is an enlarged view of a pixel of FIG. 1.
Figure 3:
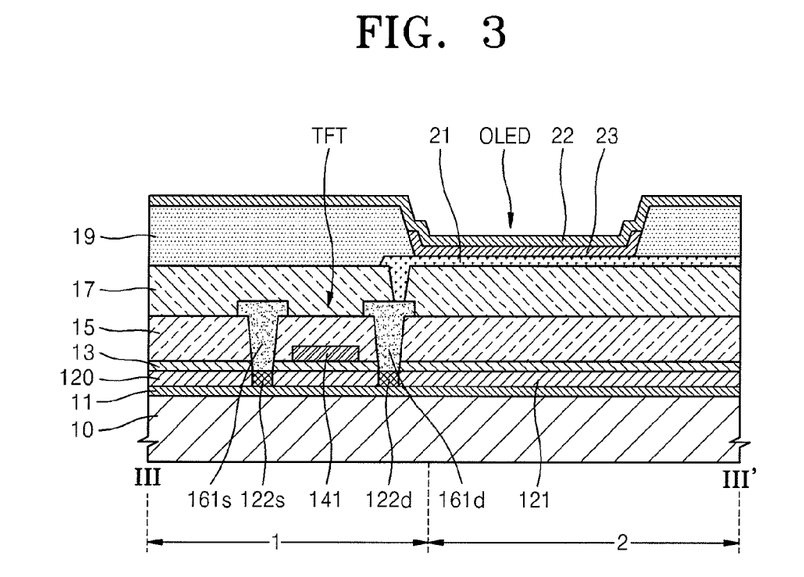
FIG. 3 is a cross-sectional view taken along a line III-III' of FIG. 2.
Figure 4:
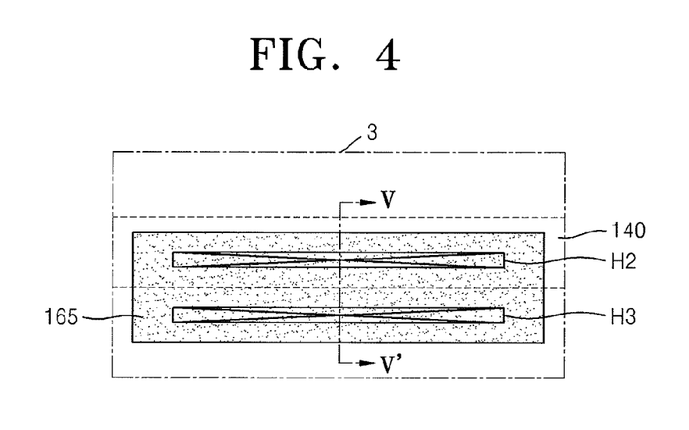
FIG. 4 is a detailed view of a line region illustrated in FIG. 2.
Figure 5:
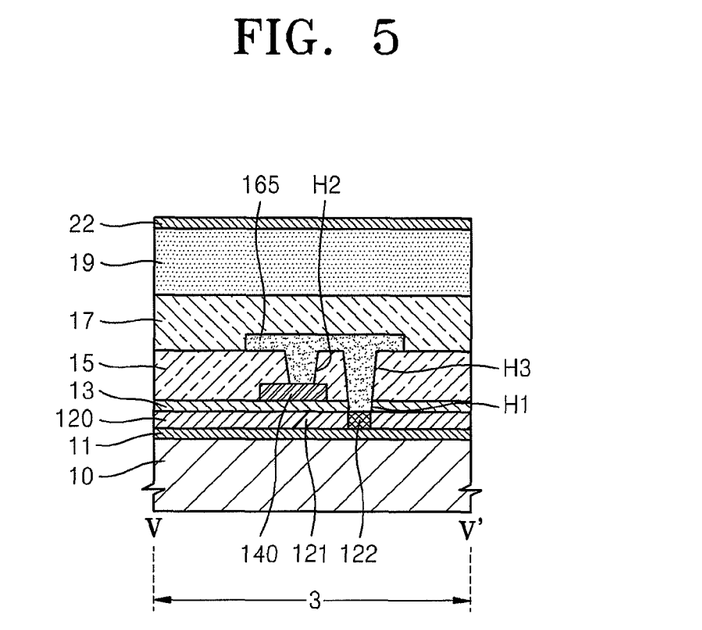
FIG. 5 is a cross-sectional view taken along a line V-V' of FIG. 4.

Expressions such as "at least one of," when preceding a list of elements, modify the entire list of elements and do not modify the individual elements of the list FIG. 1 is a schematic conceptual view of a display device according to an embodiment. FIG. 2 is an enlarged view of the pixel of FIG. 1. FIG. 3 is a cross-sectional view taken along a line III-III' of FIG. 2. FIG. 4 is a detailed view of a line region 3 illustrated in FIG. 2. FIG. 5 is a cross-sectional view taken along a line V-V' of FIG. 4.

Referring to FIG. 1, the display device includes a bottom substrate 10 having a display area DA and a non-display area NDA. The display area DA is disposed at the center of the bottom substrate 10, and is an area for displaying an image. The non-display area NDA is disposed on an edge of bottom substrate 10, surrounds the display area DA, and displays an image. A pixel P that emits light to display an image and lines for supplying electrical signals or power to the pixel P are disposed in the display area DA.

FIG. 2 illustrates only one pixel P for ease of description. However, the display area DA may include a plurality of such pixels P, and the arrangement of pixels P may vary according to a design. In addition, FIG. 2 illustrates only a portion of a gate line 140 and a portion of a data line 160 for ease of description. However, in addition to such lines, a power line and a control line may be further disposed in the display area DA.

The gate line 140 extends in a first direction X, through which a gate signal is transmitted to a pixel P from a gate driving unit (not shown). The data line 160 extends in a second direction Y substantially perpendicular to the first direction X, through which a data signal is transmitted to a pixel P from a data driving unit (not shown). The gate line 140 and the data line 160 are not limited thereto, and may vary according to a design.

Since the pixel P needs to be connected to the gate line 140 and the data line 160, the pixel P is disposed where the gate line 140 and the data line 160 cross. The pixel P includes an organic light-emitting device OLED emitting light with brightness corresponding to a driving current corresponding to the data signal, and a pixel circuit for controlling a driving current flowing in the organic light-emitting device OLED. The pixel circuit is connected to the gate line 140 and the data line 160, and the organic light-emitting device OLED is connected to the pixel circuit. The pixel circuit may include a plurality of thin film transistors and at least one capacitor.

Hereinafter, an area of the bottom substrate 10 on which a pixel circuit is formed, is referred to as a circuit area 1, and an area of the bottom substrate 10 on which an organic light-emitting device OLED is formed, is referred to as an emission area 2. Also, an area of the bottom substrate 10 on which lines are formed, is referred to as a line area 3.

Referring to FIG. 3, a pixel P including a pixel circuit and an organic light-emitting device OLED is described in detail.

Also, although the pixel P illustrated in FIG. 3 includes one thin film transistor TFT and one organic light-emitting device OLED, the pixel P may further include, in addition to the illustrated elements, other thin film transistors and a capacitor.

A thin film transistor TFT is formed on the circuit area 1, and the thin film transistor TFT may have a top gate type structure including a portion of the active layer 120, a gate electrode 141, a source electrode 161s, and a drain electrode 161d which are sequentially disposed away from the bottom substrate 10. In some embodiments, as illustrated in the drawing, the active layer 120 is disposed on the circuit area 1, the emission area 2 and the line area 3. For example, the active layer 120 is formed on substantially the entire area of the bottom substrate 10. If the active layer 120 is not patterned, a mask process for patterning the active layer 120 can be omitted, thereby leading to simplification of the manufacturing process for a display device. However, when the active layer 120 is not patterned, a plurality of thin film transistors formed in the display area DA may not be electrically separated from each other, thereby causing a short. In this case, however, the short can be prevented by electrically separating adjacent devices by partial doping.

A planarization film 17 is formed to cover the thin film transistor TFT. The planarization film 17 may be a film formed of an inorganic material and/or organic material, which may have a single or multi-layered structure. For example, the inorganic material may be metal oxide or metal nitride, and in particular, the inorganic material may be silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). In addition, the organic material may be a typically used polymer, such as polymethylmethacrylate (PMMA) or polystyrene (PS), a polymer derivative having a phenol-based group, an acryl-based polymer, an imide-based polymer, an arylether-based polymer, an amide-based polymer, a fluorine-based polymer, a p-xylene-based polymer, a vinylalcohol-based polymer, or a blend thereof. In addition, the planarization film 17 may be formed as a composite stack of an inorganic insulating film and an organic insulating film. The planarization film 17 is formed to remove a step caused by the thin film transistor TFT, and to planarize a top surface to prevent the display device OLED from being defective due to an uneven structure disposed under the display device OLED.

A display device is formed on the planarization film 17. According to the present embodiment, an organic light-emitting device OLED including an emission layer formed of an organic material is used as a display device. However, the present invention is not limited thereto, that is, a liquid display apparatus including a liquid display device may instead be used as a display device and a back light element.

Also, the organic light-emitting device OLED illustrated FIG. 2 is formed on the thin film transistor TFT. However, the present invention is not limited thereto. The organic light-emitting device OLED may include an island-type first electrode 21 (see FIG. 3), and to omit a mask process for patterning the first electrode 21, the first electrode 21 may be formed at the same level as the gate electrode 141 of the thin film transistor TFT. In this case, the gate electrode 141 may be a double layer formed of a material that constitutes the first electrode 21 and a low-resistance material that constitutes the gate electrode 141, which are sequentially stacked. That is, the organic light-emitting device OLED can be instead formed on the gate insulating film 13, not on the planarization film 17 as illustrated in FIG. 3.

The organic light-emitting device OLED includes the first electrode 21, a second electrode 22, and an intermediate layer 23 interposed between the first electrode 21 and the second electrode 22. When the display device is a bottom emission type display device that emits light toward the bottom substrate 10, the first electrode 21 is a transparent electrode and the second electrode 22 is a reflective electrode. On the other hand, when the display device is a top emission type display device that emits light in the opposite direction of the bottom substrate 10, the first electrode 21 is a reflective electrode and the second electrode 22 is a semi-transparent electrode. When the display device is a dual emission type display device, the first electrode 21 is a transparent electrode and the second electrode 22 is a semi-transparent electrode.

When the first electrode 21 functions as an anode, at least one material selected from the group consisting of indium tin oxide (ITO), indium zinc oxide (IZO), zinc oxide (ZnO), indium oxide ($In_2O_3$), indium galium oxide (IGO), and aluminium zinc oxide (AZO) which are high-k materials may be used to form the first electrode 21. The first electrode 21 may be patterned in an island type corresponding to each pixel. In addition, the first electrode 21 may be connected to the drain electrode 161d of the thin film transistor TFT to receive a current therefrom.

A pixel define film 19 exposing a portion of the first electrode 21 to define the emission area 2 is formed on the first electrode 21. The pixel define film 19 may be formed by, for example, spin coating at least one organic insulating material selected from the group consisting of polyimide, polyamide, an acryl resin, benzocyclobutene, and a phenol resin. The intermediate layer 23 is formed on the emission area 2 defined by the pixel define film 19. The intermediate layer 23 may include an organic emission layer that emits light with a predetermined wavelength. The organic emission layer may include an organic material.

When the organic emission layer is a low molecular weight organic layer formed of a low molecular weight organic material, a hole transport layer (HTL) and a hole injection layer (HIL) are stacked in a direction from the organic emission layer to the first electrode 21, and an electron transport layer (ETL) and an electron injection layer (EIL) are stacked in a direction from the organic emission layer to the second electrode 22. According to another embodiment, various other layers than the HIL, the HTL, the ETL, and the EIL may further be stacked according to purpose.

According to the present embodiment, each pixel independently includes an organic emission layer. In this regard, a pixel may emit red light, green light, or blue light, and a group of pixels emitting red light, green light, and blue light may constitute one unit pixel. However, the present invention is not limited thereto, and for example, all pixels may share one organic emission layer. For example, a plurality of organic emission layers emitting red light, green light, and blue light may be vertically stacked or mixed to form white light. The combination of color to emit white light is not limited thereto. in this case, a color conversion layer for converting emitted white light to a predetermined color or a color filter may be independently included.

The second electrode 22 may be formed of a conductive inorganic material. When the second electrode 22 functions as a cathode, Li, Ca, LiF/Ca, LiF/Al, Al, Mg, or Ag which are low-k materials may be used to form the second electrode 22. The second electrode 22 may be formed as a common electrode throughout the display area DA where an image is embodied. In this regard, the second electrode 22 may be formed by using an evaporation process that does not harm the intermediate layer 23. According to another embodiment, the first electrode 21 may be a cathode and the second electrode 22 may be an anode.

In addition, the organic light-emitting device OLED formed on the bottom substrate 10 is sealed from an external air. For example, the organic light-emitting device OLED may be sealed with an encapsulation substrate that is to contact the bottom substrate 10 by using a sealing member. According to an embodiment, a thin film encapsulation layer may be formed on substantially the entire surface of the bottom substrate 10 to seal the organic light-emitting device OLED.

Then, referring to FIGS. 4 and 5, the line area 3 illustrated in FIG. 2 is described in detail. As described above, the active layer 120 is not patterned, and is positioned on the circuit area and the line area 3, thereby covering substantially the entire area of the bottom substrate 10. However since the active layer 120 includes a semiconductor material, a parasitic capacitance, which is not intended, may occur between a line and a portion of the active layer 120 at least partially overlapping with a line. In particular, a gate insulating film 13, which is relatively thin, is formed between the gate line 140 and the active layer 120. Accordingly, a parasitic capacitance occurring between the gate line 140 and the active layer 120 causes RC delay of the gate line 140, causing a decrease in quality of a display. Accordingly, according to embodiments, a contact electrode 165 is formed to remove the cap coupling between the gate line 140 and the active layer 120 under the gate line 140 to remove the RC delay of the gate line 140.

According to the present embodiment, the contact electrode 165 is formed to electrically connect the gate line 140 to the active layer 120. However, the present invention is not limited thereto. That is, the contact electrode 165 may be applied to any one of various structures that are designed to remove a parasitic capacitance due to an unintended overlap in a structure for omitting a mask process. For example, a contact electrode may be disposed between other lines and an active layer.

In addition, the contact electrode 165 is formed on an area in which the contact electrode 165 does not overlap with other lines. For example, a crossing area of the gate line 140 and the data line 160 does not have a space for the contact electrode 165, and accordingly, the contact electrode 165 is not disposed in the crossing area.

The contact electrode 165 may electrically connect the gate line 140 to the active layer 120 adjacent to the gate line 140. The contact electrode 165 is formed as far as possible from the pixel P. The gate insulating film 13 and an interlayer insulating film 15 covering the active layer 120 and the gate line 140 may have openings H1, H2, and H3, and the contact electrode 165 may electrically connect the active layer 120 to the gate line 140 via the openings H1, H2, and H3. Portions of the active layer 120 opened by the openings H1, H2, and H3 are doped with high-concentration impurities, so that when the contact electrode 165 contacts the active layer 120, a contact resistance is reduced, and the contact electrode 165 makes a portion of the active layer 120 adjacent to the gate line 140 have a potential similar to that of the gate line 140. Accordingly, a second area 122, which is the portions of the active layer 120 exposed by the openings H1, H2, and H3 of the interlayer insulating film 15, may have higher carrier concentration than a first area 121, which is a portion of the active layer 120 covered by the interlayer insulating film 15.

Figure 6:
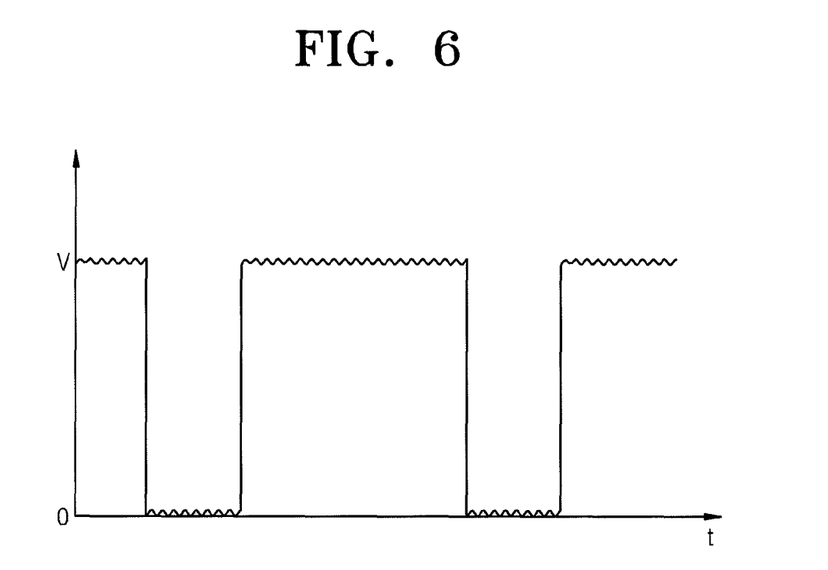
FIG. 6 is a diagram showing effects of embodiments.

In the present embodiment, when the gate line 140 and the active layer 120 are electrically connected to each other by the contact electrode 165, the gate line 140 and the active layer 120 may have equipotentiality, or a parasitic capacitance thereof may be removed or reduced to make them have similar potentials. Ultimately, as confirmed in FIG. 6, RC delay of the gate line 140 is removed and thus, a display quality improves. Also, since the contact electrode 165 is formed adjacent to the gate line 140 and relatively spaced from the pixel P, even when a potential is applied to the active layer 120 by the contact electrode 165, this does not affect the pixel P.

FIGS. 7 to 10 are cross-sectional views illustrating a method of forming a thin film transistor (TFT) and the line region 3 illustrated in FIGS. 3 and 5. Referring to FIGS. 7 to 10, the thin film transistor TFT and the line area 3 are illustrated to be close to each other. Actually, however, the two elements are spaced apart from each other farther than that illustrated in the drawing.

Figure 7:
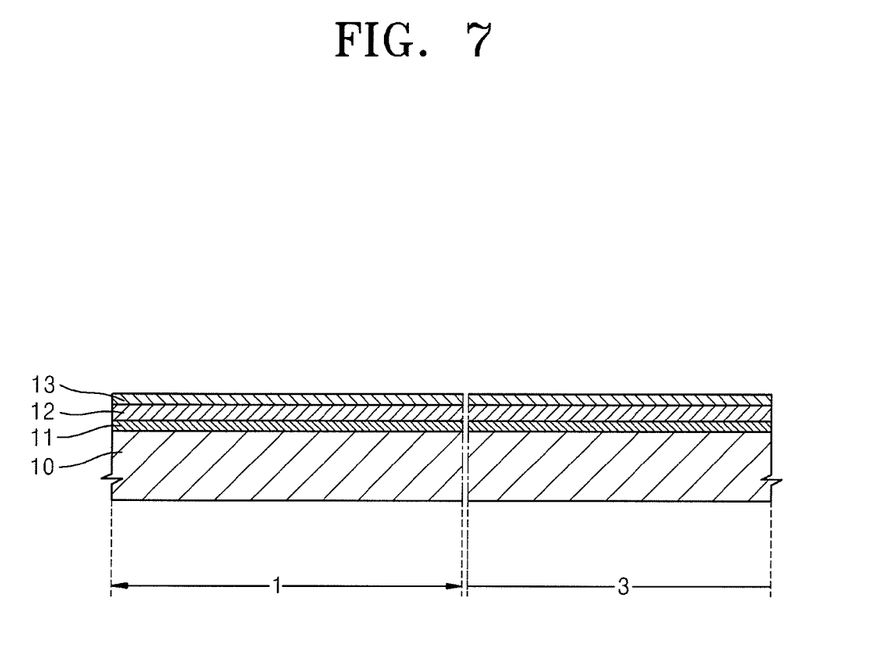
FIGS. 7 to 10 are cross-sectional views illustrating a method of forming a thin film transistor (TFT) and a line region illustrated in FIGS. 3 and 5.

First, the bottom substrate 10 is prepared. The bottom substrate 10 supports a display device and maintains rigidity thereof. The bottom substrate 10 may have a flat top surface and may be formed of a transparent insulating material. For example, the bottom substrate 10 may be formed of glass. However, a material for forming the bottom substrate 10 is not limited thereto. According to another embodiment, the bottom substrate 10 may be formed of a plastic material, such as polyethersulfone (PES), polyethersulphone, polyacrylate (PAR), or polyacrylate. According to another embodiment, the bottom substrate 10 may be formed of a non-transparent material, such as metal or carbon fiber. According to another embodiment, to embody a flexible display device, the bottom substrate 10 may be a flexible plastic, such as a polyimide (PI) film.

Referring to FIG. 7, a buffer film 11 is formed on the bottom substrate 10. The buffer film 11 may planarize a top surface of the buffer film 11 and may prevent permeation of impurities. The buffer film 11 may be formed as a multi or single-layered film formed of an inorganic material, such as silicon oxide (SiOx) and/or silicon nitride (SiNx), and in this regard, various deposition methods may be used. The buffer film 11 may be omitted, if required.

A semiconductor layer 12 is formed on the buffer film 11. The semiconductor layer is in a state in which a particular area thereof is not doped with a high-concentration impurity. The semiconductor layer 102 includes a semiconductor material, and for example, the semiconductor layer 102 may include amorphous silicon or polycrystalline silicon formed by crystallizing amorphous silicon. For example, the semiconductor layer 12 illustrated in FIG. 7 includes polycrystalline silicon, and the semiconductor layer 12 may include a small amount of impurities that are diffused and heat-treated after blanket doping.

However, the present invention is not limited thereto, and the semiconductor layer 12 may include, for example, an oxide semiconductor material having a structure of G—I—Z—O [$In_2O_3$)a($Ga_2O_3$)b(ZnO)c] where a, b, and c are real numbers satisfying conditions of a≥0, b≥0, and c≥0, respectively. In this regard, the semiconductor layer 12 may include, in addition to GIZO, Groups 12, 13, and 14 metal elements, such as zinc (Zn), indium (In), gallium (Ga), tin (Sn), cadmium (Cd), germanium (Ge), or hafnium (Hf), and a combination thereof.

Then, without patterning the semiconductor layer 12, the gate insulating film 13 is formed on the semiconductor layer 12. Herein, the gate insulating film 13 may have a single- or multi-layered structure formed of an inorganic material, such as silicon oxide or silicon nitride, and various deposition methods may be used to form the gate insulating film 13.

According to embodiments, the semiconductor layer 12 is formed on, in addition to the circuit area 1, the emission area 2 and the line area 3. That is, the semiconductor layer 120 is formed on substantially the entire area of the bottom substrate 10. That is, the semiconductor layer 12 is formed directly on the gate insulating layer 13 without patterning with a mask, and accordingly, a mask process for the semiconductor layer 12, which is included in a typical manufacturing process, may be omitted herein.

Figure 8:
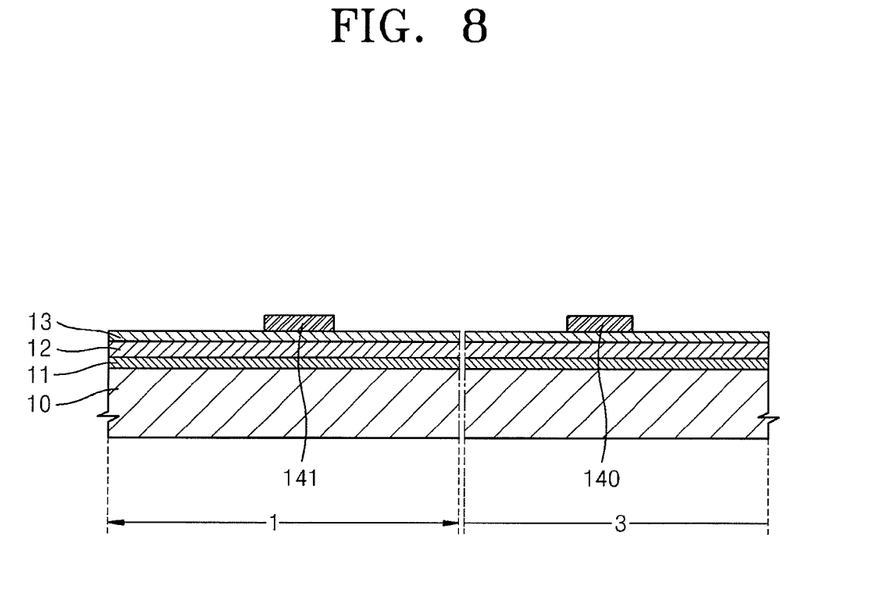

Then, as illustrated in FIG. 8, the gate line 140 and the gate electrode 141 are formed. In one embodiment, a conductive layer (not shown) is formed on substantially the entire surface of the gate insulating film 13. The conductive layer may be a multi- or single-layer including at least one metal material selected from the group consisting of Ag, Mg, Al, Pt, Pd, Au, Ni, Nd, Ir, Cr, Li, Ca, Mo, Ti, W, MoW, and Al/Cu. After the conductive layer is formed, a mask process using a first mask (not shown) is performed to pattern the gate line 140 on the line area 3 and the gate electrode 141 in the circuit area 1. Although not illustrated herein, the gate line 140 and the gate electrode 141 may be electrically connected to each other.

Figure 9:
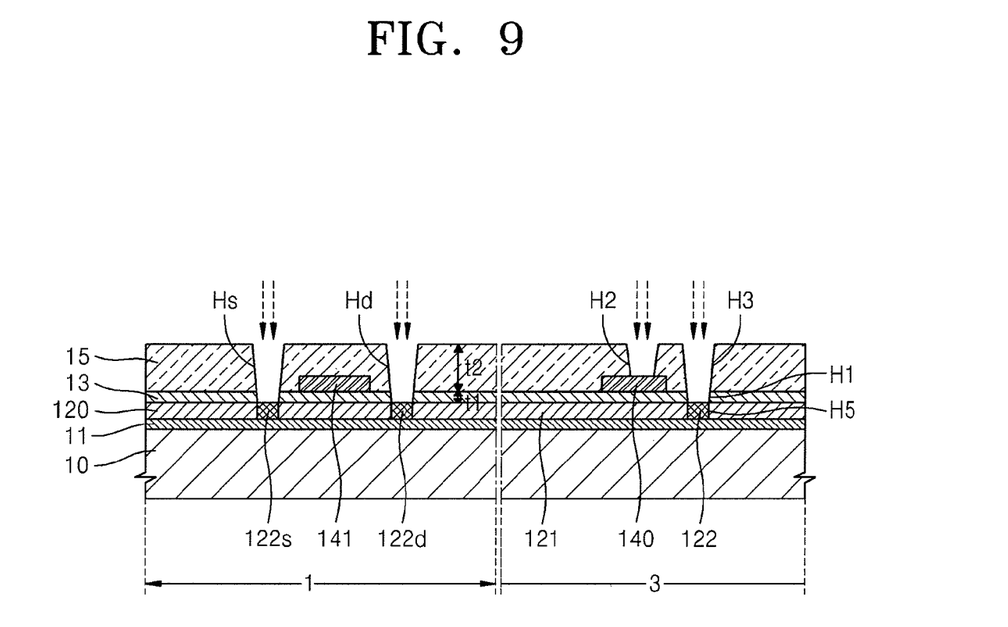

Then, as illustrated in FIG. 9, the interlayer insulating film 15 is formed and contact holes Hs and Hd and openings H1, H2, and H3 exposing the semiconductor layer 12 is formed in the gate insulating film 13 and the interlayer insulating film 15. In detail, the interlayer insulating film 15 is formed on the gate insulating film 13 to cover the gate line 140 and the gate electrode 141. A thickness t2 of the interlayer insulating film 15 is greater than a thickness t1 of the gate insulating film 13. The interlayer insulating film 15 may be formed as a multi- or single-layer formed of an inorganic material film. For example, the inorganic material may be metal oxide or metal nitride, and in particular, the inorganic material may be silicon oxide ($SiO_2$), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZrO_2$). However, the interlayer insulating film 15 may instead be formed as a multi- or single-layer formed of an organic material film. According to another embodiment, a film formed of an inorganic material and a film formed of an organic material may be alternately formed. After the formation of the interlayer insulating film 15, a mask process is performed using a second mask (not shown) to form the contact holes Hs and Hd in portions of the gate insulating film 13 and the interlayer insulating film 15 corresponding to the circuit area 1, and the openings H1, H2, and H3 are formed in the portions of the gate insulating film 13 and the interlayer insulating film 15 corresponding to line area 3.

In detail, the contact holes Hs and Hd are formed on the gate insulating film 13 and the interlayer insulating film 15, adjacent to the gate electrode 141 of the thin film transistor TFT, and may include a source contact hole Hs and a drain contact hole Hd. The contact holes Hs and Hd remove the interlayer insulating film 15 and the gate insulating film 13 to expose semiconductor layer 12.

The openings H1, H2, and H3 may be formed above the gate line 140 and adjacent to the gate line 140, and may include first through third openings H1, H2, and H3. The second opening H2 is formed on the interlayer insulating film 15 on the gate line 140 to expose the gate line 140. The first opening H1 is formed on the gate insulating film 13 on a portion of the semiconductor layer 12 adjacent to the gate line 140. The third opening H3 is connected to the first opening H1 and is formed on the interlayer insulating film 15 on a portion of the semiconductor layer 12 adjacent to the gate line 140. Accordingly, the semiconductor layer 12 is exposed by the first opening H1 and the third opening H3.

Then, referring to FIG. 9, a high-concentration impurity is doped into the semiconductor layer 12 via the contact holes Hs and Hd and openings H1, H2, and H3 by using the interlayer insulating film 15 as a mask, and then, diffused and heat treated, thereby forming the active layer 120. The impurity may be an n-type or p-type impurity, and for example, a tree-valent boron (B) or a five-valent phosphorous (P). Since the interlayer insulating film 15 is thick, a portion of the semiconductor layer 12 covered by the interlayer insulating film 15 may not be well doped with impurities. However, the portion of the semiconductor layer 12 exposed by the interlayer insulating film 15 is doped with high-concentration impurities and thus, a carrier concentration thereof may increase. In detail, the portion of the semiconductor layer 12 exposed by the source contact hole Hs and the portion of the semiconductor layer 12 exposed by the drain contact hole Hd may each be doped with high-concentration impurities, thereby forming an source area 122s and a drain area 122d, respectively. The source area 122s and the drain area 122d may reduce a contact resistance when the source electrode 161s and the drain electrode 161d contact the source area 122s and the drain area 122d, respectively, and may allow a current to flow therein to drive a thin film transistor. In addition, the portions of the semiconductor layer 12 exposed by the first opening H1 and third opening H3 are doped with high-concentration impurities, thereby forming a second area 122 with a relatively high carrier concentration. Since the interlayer insulating film 15 functions as a mask, an area W1 of the second area 122 corresponds to a size W2 of the third opening H3. The second area 122 may reduce a contact resistance when the contact electrode 165 is brought into contact and may make the active layer 120 have a potential that is similar to that of the adjacent gate line 140. In addition, the remaining area of the active layer 120 that is not doped with high-concentration impurities is to be referred to as a first area 121, so that the remaining area is distinguished from the second area 122. Accordingly, the second area 122 is an area with a higher carrier concentration than the first area 121.

Figure 10:
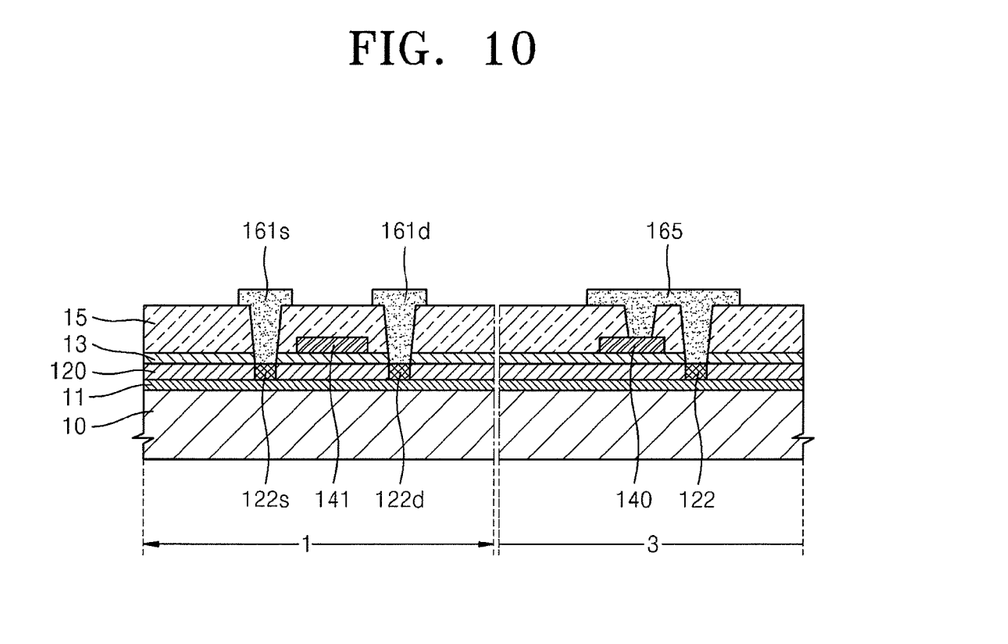

Then, as illustrated in FIG. 10, a source electrode 161s, a drain electrode 161d, and a contact electrode 165 are formed.

In detail, a conductive layer (not shown) filling the contact holes Hs and Hd and the openings H1, H2, and H3 and completely covering the interlayer insulating film 15 is formed. The conductive layer may be a multi- or single-layer including at least one metal material selected from the group consisting of Ag, Mg, Al, Pt, Pd, Au, Ni, Nd, Ir, Cr, Li, Ca, Mo, Ti, W, MoW, and Al/Cu. After the conductive layer is formed, a mask process using a third mask (not shown) is performed to pattern the source electrode 161s and the drain electrode 161d on the circuit area 1 and the contact electrode 165 on the line area 3.

The source electrode 161s and the drain electrode 161d respectively contact the source area 122s and the drain area 122d via the source contact hole Hs and the drain contact hole Hd.

The contact electrode 165 contacts the gate line 140 via the second opening H2, and contacts the second area 122 via the first opening H1 and the third opening H3. As described above, the contact electrode 165 electrically connects the gate line 140 to the second area 122 adjacent to the gate line 140. Herein, the wording "the second area 122 adjacent to the gate line 140" may indicate that the second area 122 may be relatively closer to the gate line 140 than the pixel (P of FIG. 2). From such a structure, when an electric signal flows in the gate line 140, due to the contact electrode 165, a potential that is similar to that of the gate line 140 may flow even in the second area 122 and the first area 121 of the active layer 120 at least partially overlapping with the gate line 140. From among the first area 121, a portion of the first area 121 at least partially overlapping with the gate line 140 may have a similar potential due to the gate line 140 and the adjacent second area 122. Accordingly, a parasitic capacitance between the gate line 140 and the portion of the active layer 120 at least partially overlapping with the gate line may be removed or reduced. In conclusion, RC delay of the gate line 140 may decrease and a display quality may improve.

Figure 11:
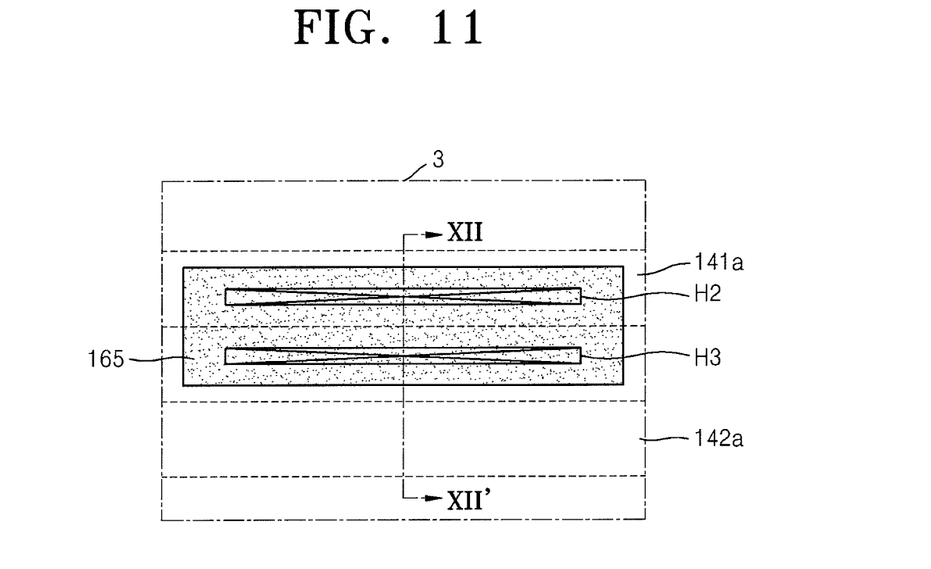
FIG. 11 is a detailed view of a line region illustrated in FIG. 2, according to another embodiment.
Figure 12:
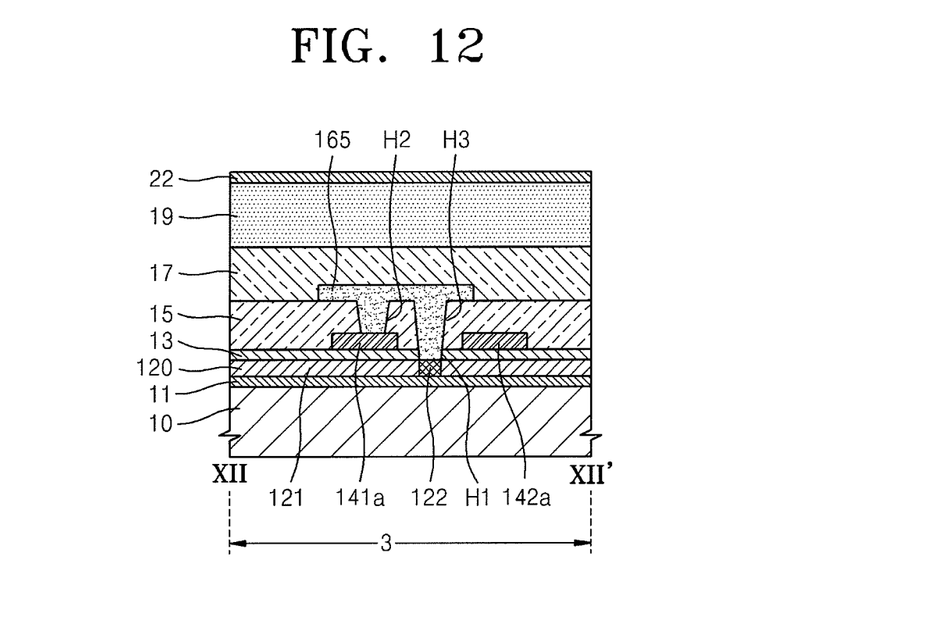
FIG. 12 is a cross-sectional view taken along a line X II-X II' of FIG. 10.

FIG. 11 is a detailed view of a line region illustrated in FIG. 2, according to another embodiment. FIG. 12 is a cross-sectional view taken along a line X II-X II' of FIG. 10.

In comparison to embodiments illustrated in FIGS. 4 and 5, according to embodiments illustrated in FIGS. 11 and 12, the gate line 140 is divided into two and then the two is summed up. The gate line 140 may be divided into a plurality of lines and then, the lines are summed up in a portion of the line area. Herein, the divided gate lines may be referred to as a first sub gate line 141*a* and a second sub gate line 142*a*. The contact electrode 165 may be disposed to be connected with the active layer 120 adjacent to one of the first sub gate line 141*a* and the second sub gate line 142. The contact electrode 165 may be disposed between the first sub gate line 141*a* and the second sub gate line 142.

Referring to FIGS. 10 and 11, a gate line is divided into two lines, but embodiments are not limited thereto, and for example, a gate line may be divided into three or more lines.

Figure 13:
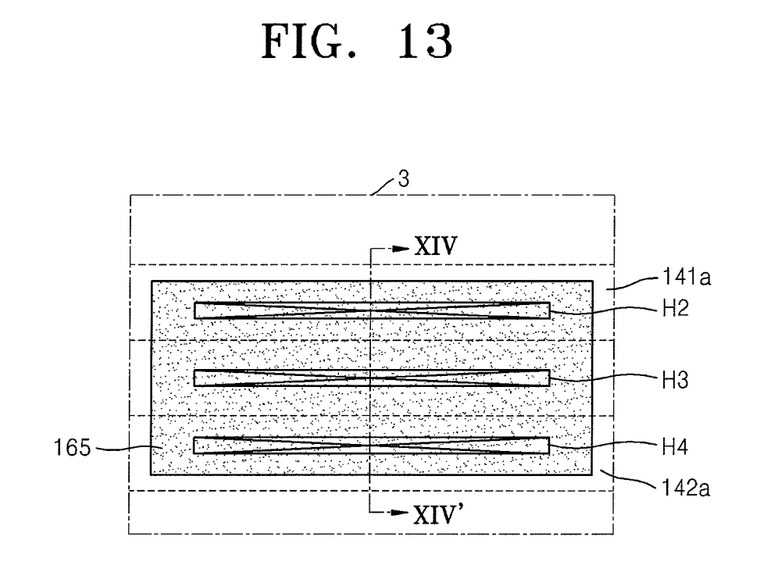
FIG. 13 is a detailed view of a line region illustrated in FIG. 2, according to another embodiment.
Figure 14:
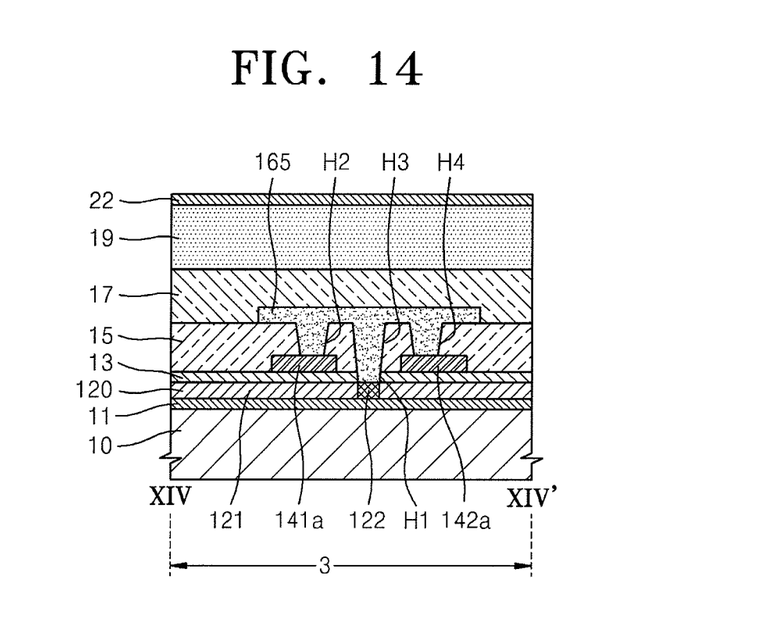
FIG. 14 is a cross-sectional view taken along a line X IV-X IV' of FIG. 13.

FIG. 13 is a detailed view of a line region illustrated in FIG. 2, according to another embodiment. FIG. 14 is a cross-sectional view taken along a line X V-X IV' of FIG. 13.

In comparison of the embodiments illustrated in FIGS. 11 and 12, according to embodiments illustrated in FIGS. 13 and 14, a contact electrode is electrically connected to all the divided lines of the gate line 140. In detail, the contact electrode 165 electrically contacts the first sub gate line 141*a* and the second sub gate line 142, and connects the first and second sub gate lines 141*a* and 142*a* to the active layer 120. The formation of a similar potential of gate lines and an active layer in the present embodiment may be more easily performed than in the previous embodiments.

According to the embodiments illustrated in FIGS. 11 to 14, a closed space partitioned by the first sub gate line 141*a* and the second sub gate line 142*a* may be formed. Accordingly, in addition to the interlayer insulating film 15, the first sub gate line 141*a* and the second sub gate line 142*a* may be used as a mask to dope a semiconductor layer. If only gate lines are used as a mask, a gate line is formed and then, a semiconductor layer is doped to form an active layer. Since the overlapping portion of the active layer with the gate line is not doped with impurities, a formed device may be electrically separated from other devices, and herein, the gate line may function as a guide.

According to the above embodiments, mask-pattering of an active layer is omitted, and thus, lesser number of masks are required, leading to a decrease in manufacturing costs and simplification of a manufacturing process.

Also, according to the above embodiments, a parasitic capacitance occurring between an active layer and a line is removed, so that RC delay of a line is improved and a display quality may be improved.

While the above embodiments have been described with reference to the accompanying drawings, it will be understood by those of ordinary skill in the art that various changes in form and details may be made therein without departing from the spirit and scope of the present invention as defined by the following claims.

What is claimed is:

1. A substrate for a display device, the substrate comprising:
   a bottom substrate;
   a light emitting region formed over the bottom substrate;
   an active layer formed on a portion of the bottom substrate, wherein the active layer comprises a first area and a second area with a higher carrier concentration than the first area;
   a line at least partially overlapping with the first area; and
   a contact electrode directly connecting the line to the second area of the active layer,
   wherein the active layer is formed over an entire top surface of the bottom substrate, and wherein the bottom substrate overlaps both the active layer and the light emitting region in a depth dimension of the substrate for the display device.

2. The substrate of claim 1, wherein the second area does not overlap with the line and is disposed adjacent to the line.

3. The substrate of claim 1, wherein the active layer comprises silicon.

4. The substrate of claim 1, further comprising:
   a first insulating layer covering the active layer and comprising a first opening exposing the second area,
   wherein the line is formed to at least partially overlap with the first area on the first insulating layer.

5. The substrate of claim 4, further comprising:
   a second insulating layer comprising a second opening covering the line and exposing a portion of the line and a third opening connected to the first opening.

6. The substrate of claim 5, wherein an area of the second area corresponds to a size of the third opening.

7. The substrate of claim 5, wherein the thickness of the second insulating layer is greater than the thickness of the first insulating layer.

8. The substrate of claim 5, wherein the contact electrode is formed on the second insulating layer and configured to electrically connect the line to the active layer via the first opening, the second opening, and the third opening.

9. The substrate of claim 1, wherein the line is electrically connected to a thin film transistor.

10. The substrate of claim 1, wherein the line comprises a plurality of lines that cross each other, and wherein the contact electrode is disposed over the lines.

11. A display device comprising:
    a bottom substrate;
    a light emitting region formed over the bottom substrate;
    an active layer formed on a portion of the bottom substrate, wherein the active layer comprises a first area and a second area with a higher carrier concentration than the first area;
    a thin film transistor comprising a portion of the active layer, a gate electrode, a source electrode, and a drain electrode, wherein the active layer is formed over an entire top surface of the bottom substrate, and wherein the bottom substrate overlaps both the active layer and the light emitting region in a depth dimension of the display device;
    a gate line electrically connected to the gate electrode and at least partially overlapping with the first area; and
    a contact electrode directly connecting the gate line to the second area.

12. The display device of claim 11, further comprising:
    a first insulating layer covering the active layer and comprising a first opening exposing the second area,
    wherein the gate line is formed to at least partially overlap with the first area on the first insulating layer.

13. The display device of claim 12, further comprising:
    a second insulating layer comprising a second opening covering the gate line and exposing a portion of the gate line and a third opening connected to the first opening,
    wherein the source electrode and the drain electrode are formed on the second insulating layer, corresponding to the active layer.

14. The display device of claim 13, wherein an area of the second area corresponds to a size of the third opening.

15. The display device of claim 13, wherein the thickness of the second insulating layer is greater than the thickness of the first insulating layer.

16. The display device of claim 13, wherein the contact electrode is formed on the second insulating layer and configured to electrically connect the gate line to the active layer via the first opening, the second opening, and the third opening.

17. The display device of claim 13, wherein the contact electrode is formed at the same level and is formed of a same material as the source electrode and the drain electrode.

18. The substrate of claim 1, wherein the width of the active layer is greater than the width of the contact electrode.

19. The substrate of claim 1, wherein the active layer is a single layer that comprises source and drain areas therein.

20. The substrate of claim 1, further comprising a capacitor formed over the bottom substrate, wherein the bottom substrate overlaps both the active layer and the capacitor in the depth dimension of the substrate for the display device.

* * * * *